United States Patent
Dening

(10) Patent No.: US 6,970,040 B1
(45) Date of Patent: Nov. 29, 2005

(54) MULTI-MODE/MULTI-BAND POWER AMPLIFIER

(75) Inventor: David Dening, Stokesdale, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 0 days.

(21) Appl. No.: 10/712,661

(22) Filed: Nov. 13, 2003

(51) Int. Cl.[7] .......................... H03F 3/68; H03F 3/191
(52) U.S. Cl. ...................... 330/126; 330/302; 330/295; 330/124 R
(58) Field of Search .......................... 330/126, 124 R, 330/295, 302

(56) References Cited

U.S. PATENT DOCUMENTS

| | | | | |
|---|---|---|---|---|
| 5,608,353 | A | 3/1997 | Pratt | 330/295 |
| 5,629,648 | A | 5/1997 | Pratt | 330/289 |
| 5,774,017 | A * | 6/1998 | Adar | 330/51 |
| 6,091,966 | A * | 7/2000 | Meadows | 330/124 R |
| 6,130,579 | A | 10/2000 | Iyer et al. | 330/285 |
| 6,191,656 | B1 | 2/2001 | Nadler | 330/288 |
| 6,229,395 | B1 | 5/2001 | Kay | 330/252 |
| 6,265,943 | B1 | 7/2001 | Dening et al. | 330/296 |
| 6,271,727 | B1 | 8/2001 | Schmukler | 330/284 |
| 6,285,239 | B1 | 9/2001 | Iyer et al. | 327/531 |
| 6,307,364 | B1 | 10/2001 | Augustine | 324/95 |
| 6,313,705 | B1 | 11/2001 | Dening et al. | 330/276 |
| 6,329,809 | B1 | 12/2001 | Dening et al. | 324/95 |
| 6,333,677 | B1 | 12/2001 | Dening | 330/296 |
| 6,356,150 | B1 | 3/2002 | Spears et al. | 330/145 |
| 6,369,656 | B2 | 4/2002 | Dening et al. | 330/296 |
| 6,369,657 | B2 | 4/2002 | Dening et al. | 330/296 |
| 6,392,487 | B1 | 5/2002 | Alexanian | 330/254 |
| 6,404,287 | B2 | 6/2002 | Dening et al. | 330/296 |
| 6,525,611 | B1 | 2/2003 | Dening et al. | 330/298 |
| 6,528,983 | B1 | 3/2003 | Augustine | 324/95 |
| 6,566,963 | B1 | 5/2003 | Yan et al. | 330/311 |
| 6,624,702 | B1 | 9/2003 | Dening | 330/297 |
| 6,658,265 | B1 * | 12/2003 | Steel et al. | 455/553.1 |
| 6,701,134 | B1 | 3/2004 | Epperson | 455/102 |
| 6,701,138 | B2 | 3/2004 | Epperson et al. | 455/127.3 |
| 6,720,831 | B2 | 4/2004 | Dening et al. | 330/298 |
| 6,724,252 | B2 | 4/2004 | Ngo et al. | 330/133 |
| 6,724,265 | B2 | 4/2004 | Humphreys | 331/17 |
| 2004/0072597 | A1 | 4/2004 | Epperson et al. | 455/572 |

* cited by examiner

*Primary Examiner*—Khanh V. Nguyen
(74) *Attorney, Agent, or Firm*—Withrow & Terranova, PLLC

(57) ABSTRACT

The present invention provides a wideband power amplifier for a multi-mode or multi-band wireless communication device. The wideband power amplifier is configured to amplify signals in different frequency bands corresponding to different operating modes. In general, the wideband power amplifier includes multiple matching circuits that operate to combine the signals in the different frequency bands and provide a combined signal to each transistor in an output stage of the wideband power amplifier.

26 Claims, 3 Drawing Sheets

MULTI-MODE/MULTI-BAND POWER AMPLIFIER

FIELD OF THE INVENTION

The present invention relates to a power amplifier for wireless communications, and more particularly relates to a power amplifier for use in multi-mode wireless communication devices.

BACKGROUND OF THE INVENTION

The present invention is particularly useful in mobile terminals, such as personal communication assistants, pagers, headsets, wireless modems, analog and digital cellular telephones, and the like. Since many of these devices are battery-powered, amplifier efficiency is preferably maximized to extend battery life. When amplifiers are designed for their highest efficiency in converting DC energy into RF energy, parasitic losses are minimized, bandwidths are reduced to a bare minimum, harmonics are terminated, and high-Q matching networks are employed. Unfortunately, these design goals are counter to current approaches used to implement multi-mode amplifiers capable of operating at multiple frequencies, because multi-mode amplifiers are required to operate over a relatively wide bandwidth.

Most RF power amplifiers are designed to operate over a single band of frequencies. If coverage is desired for one or more additional frequency bands, a multi-band amplifier is typically created. For a dual-mode application, the most straightforward approach is to simply use two amplifiers and switch between them to select a desired band for transmission. However, using additional amplifiers increases the power consumption of the device, which results in decreased battery life, and increases the die area of the power amplifier. As such, there is a need for an improved and efficient multi-mode amplification technique.

SUMMARY OF THE INVENTION

The present invention provides a wideband power amplifier for a multi-mode or multi-band wireless communication device. The wideband power amplifier is configured to amplify signals in different frequency bands corresponding to different operating modes. In general, the wideband power amplifier includes multiple matching circuits that operate to combine the signals in the different frequency bands and provide a combined signal to each transistor in an output stage of the wideband power amplifier.

Accordingly, the present invention relates to a radio frequency communication system including radiating circuitry and a wideband power amplifier output stage. The radiating circuitry includes an antenna and has a load impedance. The wideband power amplifier output stage is coupled to the radiating circuitry and amplifies a radio frequency signal in each of a plurality of frequency bands corresponding to a plurality of operating modes. The wideband power amplifier output stage includes an output transistor array comprising multiple output transistors and multiple matching circuits each adapted to couple the radio frequency signal in a corresponding one of the plurality of frequency bands to a first terminal of each of the multiple output transistors.

In one embodiment, each of the multiple matching circuits includes multiple capacitive circuits coupling the signals in the different frequency bands to each transistor in an output stage of the wideband power amplifier. Each of the multiple matching circuits further includes at least one inductive shunt circuit coupled to inputs of the multiple capacitive circuits. The matching circuits have impedances that vary based on frequency. Each of the matching circuits has a small impedance in the corresponding one of the plurality of frequency bands and a large impedance in others of the plurality of frequency bands.

In another embodiment, the radio frequency communication system also includes multiple amplification stages that amplify the radio frequency signal in each of the plurality of frequency bands and provide an amplified radio frequency signal in each of the plurality of frequency bands. Each of the multiple amplification stages includes multiple amplification circuitries that each amplify the radio frequency signal in one of the plurality of frequency bands and provide the amplified radio frequency signal in the one of the plurality of frequency bands to a corresponding one of the plurality of capacitive circuitries.

In yet another embodiment, the radio frequency communication system also includes a bias network that provides bias signal to the wideband power amplifier output stage and to any additional amplification stages. In an embodiment wherein the system includes the multiple amplification stages described above, the bias network provides bias signals to each of the amplification circuitries in each of the multiple amplification stages. In operation, the bias network provides the bias signals such that select ones of the multiple amplification circuitries corresponding to the select frequency band are active and others of the multiple amplification circuitries not corresponding to the select frequency band are inactive.

In yet another embodiment, the output power of the radio frequency communication system can be controlled by bias signals provided to each amplification stage. Alternatively or in addition, the output power may be controlled by controlling supply voltages provided to each of the amplification stages.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

Figure 1:
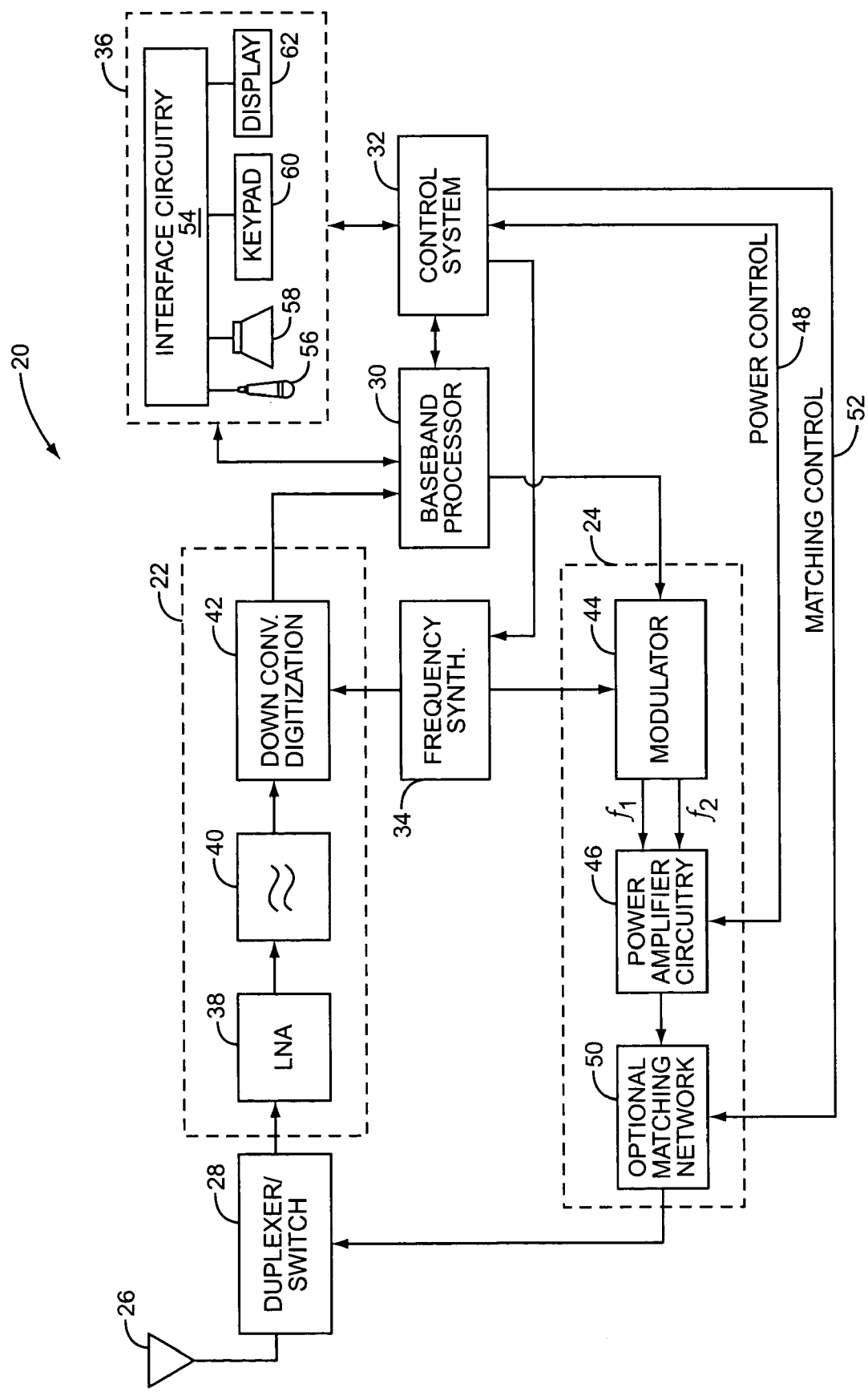
FIG. 1 is a schematic representation of a mobile terminal configured according to one embodiment of the present invention.

The present invention may be incorporated in a mobile terminal 20, such as a mobile telephone, wireless personal digital assistant, or like communication device. The basic architecture of a mobile terminal 20 is represented in FIG. 1 and may include a receiver front end 22, a radio frequency transmitter section 24, an antenna 26, a duplexer or switch 28, a baseband processor 30, a control system 32, a frequency synthesizer 34, and an interface 36. The receiver front end 22 receives information bearing radio frequency signals from one or more remote transmitters provided by a base station. A low noise amplifier 38 amplifies the signal. A filter circuit 40 minimizes broadband interference in the received signal, while downconversion and digitization circuitry 42 downconverts the filtered, received signal to an intermediate or baseband frequency signal, which is then digitized into one or more digital streams. The receiver front end 22 typically uses one or more mixing frequencies generated by the frequency synthesizer 34.

The baseband processor 30 processes the digitized received signal to extract the information or data bits conveyed in the received signal. This processing typically comprises demodulation, decoding, and error correction operations. As such, the baseband processor 30 is generally implemented in one or more digital signal processors (DSPs).

On the transmit side, the baseband processor 30 receives digitized data, which may represent voice, data, or control information, from the control system 32, which it encodes for transmission. The encoded data is output to the transmitter 24, where it is used by a modulator 44 to modulate a carrier signal that is at a desired transmit frequency. Power amplifier circuitry 46 amplifies the modulated carrier signal to a level appropriate for transmission according to a power control signal 48, and delivers the amplified and modulated carrier signal to antenna 26 through the duplexer or switch 28. Optionally, the transmitter 24 may include a matching network 50. The matching network 50 has a variable impedance that may be controlled by a matching control signal 52 in order to accommodate various antennas 26 having different load impedances. If included, the matching network 50 operates to transform the load impedance of the antenna 26 into a predefined load impedance.

The modulator 44 and power amplifier circuitry 46 are configured to operate in multiple modes, which requires transmission of modulated carrier signals at different frequencies depending on the desired mode. Within any given mode, power levels are typically dictated by a servicing base station. Further, the power amplifier circuitry 46 may be biased for saturated operation for one mode and linear operation in another. Further details are provided below.

A user may interact with the mobile terminal 20 via the interface 36, which may include interface circuitry 54 associated with a microphone 56, a speaker 58, a keypad 60, and a display 62. The interface circuitry 54 typically includes analog-to-digital converters, digital-to-analog converters, amplifiers, and the like. Additionally, it may include a voice encoder/decoder, in which case it may communicate directly with the baseband processor 30.

The microphone 56 will typically convert audio input, such as the user's voice, into an electrical signal, which is then digitized and passed directly or indirectly to the baseband processor 30. Audio information encoded in the received signal is recovered by the baseband processor 30, and converted by the interface circuitry 54 into an analog signal suitable for driving speaker 58. The keypad 60 and display 62 enable the user to interact with the mobile terminal 20, input numbers to be dialed, address book information, or the like, as well as monitor call progress information.

Figure 2:
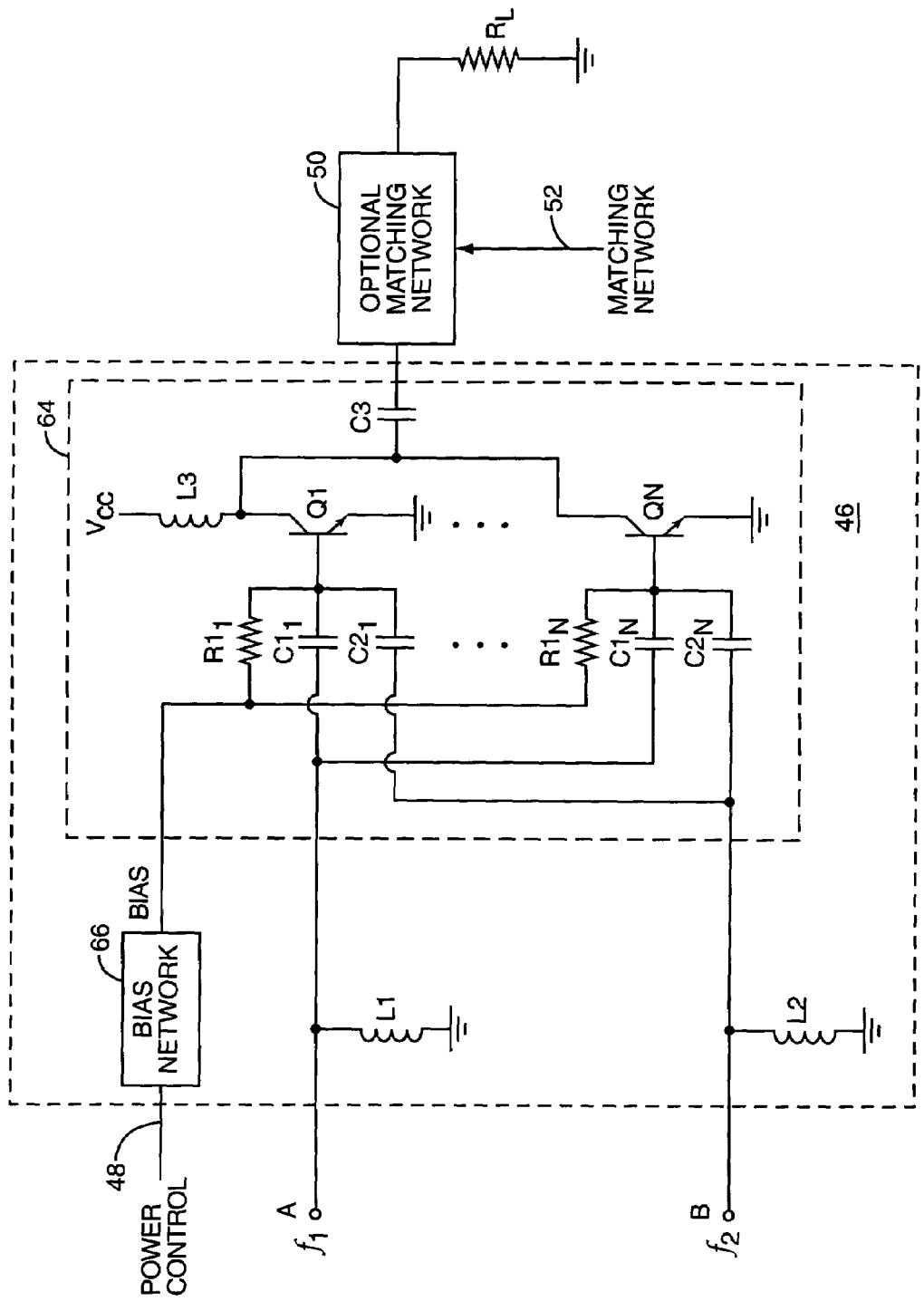
FIG. 2 is a schematic representation of power amplifier circuitry configured according to one embodiment of the present invention.

With reference to FIG. 2, an amplifier and control configuration of a one embodiment of the present invention is described in detail. According to the present invention, modulated signals in frequency bands, $f_1$ and $f_2$, from the modulator 44 are received by the power amplifier circuitry 46 at input nodes A and B, respectively, and combined at the base of each transistor in an output amplification stage 64 of the power amplification circuitry 46. The output amplification stage 64 includes an output transistor array, Q1–QN. Preferably, the output amplification stage 64 provides wideband amplification for all frequency bands, $f_1$ and $f_2$. For each of the output transistors Q1–QN, the modulated signals in the frequency bands, $f_1$ and $f_2$, are combined using separate blocking capacitors, C1 and C2, for each of the frequency bands, $f_1$ and $f_2$.

The blocking capacitors, C1 and C2, in combination with first and second inductors, L1 and L2, form first and second matching circuits. The first matching circuit (C1 and L1) has a small impedance in the first frequency band, $f_1$, and a large impedance in the second frequency band, $f_2$. The second matching circuit (C2 and L2) has a small impedance in the second frequency band, $f_2$, and a large impedance in the first frequency band, $f_1$. Thus, when operating in the first frequency band, $f_1$, the modulator 44 provides the modulated signal in the first frequency band, $f_1$. Since the second matching circuit (C2 and L2) has a large impedance in the first frequency band, $f_1$, the second matching circuit (C2 and L2) is effectively removed from the signal path of the modulated signal, thereby preventing perturbations in the modulated signal due to the second matching circuit (C2 and L2). Similarly, when operating in the second band, $f_2$, the modulator 44 provides the modulated signal in the second frequency band, $f_2$. The large impedance of the first matching circuit (C1 and L1) in the second frequency band, $f_2$, effectively removes the first matching circuit (C1 and L1) from the signal path of the modulated signal, thereby preventing perturbations in the modulated signal due to the first matching circuit (C1 and L1). It should be noted that the first and second matching circuits described above are merely exemplary and not limiting.

A bias network 66 is provided for controlling bias provided to the output amplification stage 64. The bias network 66 is configured to provide bias sufficient to support the type of amplifier operation, either linear or saturation, and amount of amplification desired to provide appropriate output power levels. As discussed above, the output amplification stage 64 may be provided by the array of identical transistors Q1 through QN. In this configuration, each transistor Q1 through QN receives identical bias from the bias network 66 through resistors $R1_1$ through $R1_N$. Notably, the collectors of transistors Q1 through QN are coupled together to provide a common output signal to a load $R_{LOAD}$, which represents the load of antenna 26. The collectors of the transistors Q1 through QN may be coupled to the load $R_{LOAD}$ via a capacitor C3 and optionally the matching network 50.

As noted, the bias network 66 will provide sufficient bias to ensure efficient operation for the given mode. If the desired mode requires the transistors Q1 through QN to operate in a linear fashion, the bias is adjusted to provide efficient linear operation. If the desired mode requires transistors Q1 through QN to operate in saturation, the bias is adjusted to provide efficient saturation operation. Further, the output amplification stage 64 can be configured to operate in saturation mode for one frequency band and in linear mode for another frequency band, if so desired.

Figure 3:
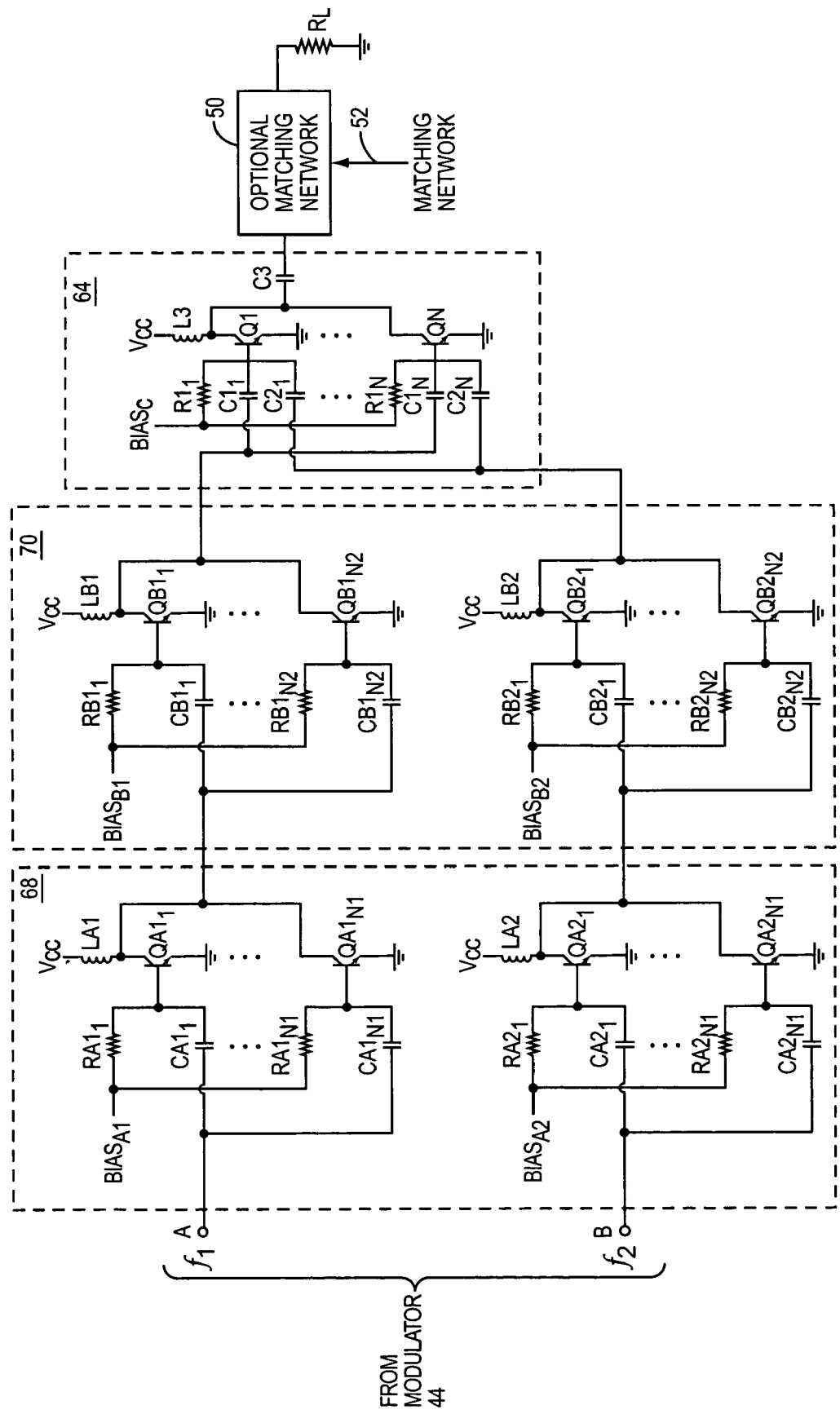
FIG. 3 is a schematic representation of power amplifier circuitry configured according to another embodiment of the present invention.

FIG. 3 illustrates another embodiment of the power amplification circuitry 46 of the present invention. In this embodiment, the power amplification circuitry includes first and second amplification stages 68 and 70 and the output amplifier stage 64 of FIG. 2. The operational details of the output amplification stage 64 are as described above with reference to FIG. 2. In general, the first and second amplification stages 68 and 70 operate to separately amplify the modulated signals in the first and second frequency bands, $f_1$ and $f_2$, from the modulator 44. The first amplification stage 68 includes a first transistor array including transistors $QA1_1$–$QA1_{N1}$. Each of the transistors $QA1_1$–$QA1_{N1}$ receives the modulated signal in the first frequency band, $f_1$, via corresponding coupling capacitors $CA1_1$–$CA1_{N1}$ and operates to amplify the modulated signal in the first frequency band, $f_1$. The first amplification stage 68 also includes a second transistor array including transistors $QA2_1$–$QA2_{N1}$. Each of the transistors $QA2_1$–$QA2_{N1}$ receives the modulated signal in the second frequency band, $f_2$, via corresponding coupling capacitors $CA2_1$–$CA2_{N1}$, and operates to amplify the modulated signal in the second frequency band, $f_2$. The transistors $QA1_1$–$QA1_{N1}$ and $QA2_1$–$QA2_{N1}$ are biased by the bias network 66 (FIG. 2) via resistors $RA1_1$–$RA1_{N1}$ and $RA2_1$–$RA2_{N1}$, respectively, using bias signals $BIAS_{A1}$ and $BIAS_{A2}$.

In a similar fashion, the second amplification stage 70 includes a third transistor array including transistors $QB1_1$–$QB1_{N2}$. Each of the transistors $QB1_1$–$QB1_{N2}$ receives the amplified signal in the first frequency band, $f_1$, from the first amplification stage 68 via corresponding coupling capacitors $CB1_1$–$CB1_{N2}$ and operates to further amplify the amplified signal in the first frequency band, $f_1$. The second amplification stage 70 also includes a fourth transistor array including transistors $QB2_1$–$QB2_{N2}$. Each of the transistors $QB2_1$–$QB2_{N2}$ receives the amplified signal in the second frequency band, $f_2$, from the first amplification stage 68 via corresponding coupling capacitors $CB2_1$–$CB2_{N2}$ and operates to further amplify the amplified signal in the second frequency band, $f_2$. The transistors $QB1_1$–$QB1_{N2}$ and $QB2_1$–$QB2_{N2}$ are biased by the bias network 66 (FIG. 2) via resistors $RB1_1$–$RB1_{N2}$ and $RB2_1$–$RB2_{N2}$, respectively, using bias signals $BIAS_{B1}$, and $BIAS_{B2}$. In this embodiment, it is important to note that bias control network 66 controls the output power and mode of operation of the power amplification circuitry 46. The mode of operation of the power amplification circuitry 46 is controlled by controlling the bias supplied to the transistors $QA1_1$–$QA1_{N1}$, $QA2_1$–$QA2_{N1}$, $QB1_1$–$QB1_{N2}$, and $QB2_1$–$QB2_{N2}$, thereby controlling which of the first and second frequency bands, $f_1$ and $f_2$, is amplified.

In operation, when operating in the first frequency band, $f_1$, the bias signals ($BIAS_{A2}$ and $BIAS_{B2}$) are such that the transistors $QA2_1$–$QA2_{N1}$, and $QB2_1$–$QB2_{N2}$ are turned off. The blocking capacitors $C2_1$–$C2_N$ and inductor LB2 form a second matching circuit having an impedance that varies based on frequency. In the first frequency band, $f_1$, the impedance of the second matching circuit is large, thereby effectively removing the second matching circuit from the signal path of the further amplified signal in the first frequency band, $f_1$, and preventing perturbation of the further amplified signal in the first frequency band, $f_1$. When operating in the second frequency band, $f_2$, the bias signals ($BIAS_{A1}$ and $BIAS_{B1}$) are such that the transistors $QA1_1$–$QA1_{N1}$ and $QB1_1$–$QB1_{N2}$ are turned off. The blocking capacitors $C1_1$–$C1_N$ and inductor LB1 form a first matching circuit having an impedance that varies based on frequency. In the second frequency band, $f_2$, the impedance of the first matching circuit is large, thereby effectively removing the first matching circuit from the signal path of the further amplified signal in the second frequency band, $f_2$, and that preventing perturbation of the further amplified signal in the second frequency band, $f_2$.

The transistors $QA1_1$–$QA1_{N1}$, $QA2_1$–$QA2_{N1}$, $QB1_1$–$QB1_{N2}$, $QB2_1$–$QB2_{N2}$, and Q1–QN are preferably heterojunction bipolar transistors (HBTs) formed on a single semiconductor and equally sized to form corresponding transistor arrays. However, the inventive concepts defined herein are independent of technology (Si, GaAs, SiGe, etc.) as well as device type (BJT, FET, MESFET, HBT, etc.). Further information pertaining to the transistor arrays illustrated in FIGS. 2 and 3 may be found in U.S. Pat. No. 5,608,353, HBT POWER AMPLIFIER, issued Mar. 4, 1997; and U.S. Pat. No. 5,629,648, HBT POWER AMPLIFIER, issued May 13, 1997, which are assigned to RF Micro Devices, Inc. of 7628 Thorndike Road, Greensboro, N.C. 27409, and wherein the disclosures are incorporated herein by reference in their entirety. Exemplary bias networks 66 capable of being used in association with the present invention are described in further detail in U.S. patent application Ser. No. 09/467,415, entitled BIAS NETWORK FOR HIGH EFFICIENCY RF LINEAR POWER AMPLIFIER, filed Dec. 20, 1999, currently pending, the disclosure of which is incorporated herein by reference in its entirety. Upon understanding the present invention, those skilled in the art will be able to construct any number of bias networks that are compatible with the present invention.

The present invention provides substantial opportunity or variation without departing from the spirit or scope of the present invention. For example, although FIGS. 2 and 3 illustrate embodiments of the present invention that combine the modulated signals in the first and second frequency bands, $f_1$ and $f_2$, it should be noted that the present invention equally applies to combining modulated signals in any number of frequency bands at the base of the transistors in the output amplification stage. Additional frequency bands may be accommodated by adding additional capacitors at the base of each of the transistors in the output amplification stage, wherein the additional capacitors respective modulated signals in the additional frequency bands provided by the modulator 44. As another example, in addition to or as an alternative to controlling the bias of the transistor array, the power amplification circuitry 46 may include circuitry for controlling the supply voltage, $V_{CC}$, supplied to the transistor array and the output power of the mobile terminal 20. Such power control circuitry may be found in U.S. patent application Ser. No. 09/979,659, entitled SINGLE OUTPUT STAGE POWER AMPLIFICATION FOR MULTIMODE APPLICATIONS, filed Oct. 11, 2001, currently pending, the disclosure of which is incorporated herein by reference in its entirety. As yet another example, although the capacitors $CA1_1$–$CA1_{N1}$, $CA2_1$–$CA2_{N1}$, $CB1_1$–$CB1_{N2}$, $CB2_1$–$CB2_{N2}$, $C1_1$–$C1_N$, and $C2_1$–$C2_N$ and bias resistors $RA1_1$–$RA1_{N1}$, $RA2_1$–$RA2_{N1}$, $RB1_1$–$RB1_{N2}$, and $R1_1$–$R1_N$ are illustrated as single elements, it should be noted that each may be an array of elements.

Those skilled in the art will recognize improvements and modifications to the preferred embodiments of the present invention. All such improvements and modifications are considered within the scope of the concepts disclosed herein and the claims that follow.

What is claimed is:

1. A power amplifier circuit comprising:
   a first input node adapted to receive a radio frequency signal when operating in a first frequency band;
   a second input node adapted to receive the radio frequency signal when operating in a second frequency band;
   an array of transistors, each transistor having an input and an output, wherein the outputs are coupled together to form a power amplifier output;
   a first matching circuit coupling the first input node to the inputs of each transistor in the array of transistors, the first matching circuit having a small impedance when operating in the first frequency band and a large impedance when operating in the second frequency band; and
   a second matching circuit coupling the second input node to the inputs of each transistor in the array of transistors, the second matching circuit having a small impedance when operating in the second frequency band and a large impedance when operating in the first frequency band.

2. The power amplifier circuit of claim 1 wherein the first matching circuit further comprises first capacitive circuits coupling the first input node to the inputs of the transistors in the array of transistors, further wherein the second matching circuit further comprises second capacitive circuits coupling the second input node to the inputs of the transistors in the array of transistors.

3. The power amplifier circuit of claim 2 wherein the first matching circuit further comprises a first inductive shunt circuit coupled to input terminals of the first of capacitive circuits, further wherein the second matching circuit further comprise a second inductive shunt circuit coupled to input terminals of the second capacitive circuits.

4. The power amplifier circuit of claim 3 wherein the first and second inductive shunt circuits are part of an amplification stage adapted to amplify the radio frequency signal in the first and second frequency bands.

5. The power amplifier circuit of claim 3 wherein the first and second inductive shunt circuits are coupled to ground.

6. The power amplifier circuit of claim 3 wherein the first and second inductive shunt circuits are coupled to a source voltage.

7. The power amplifier circuit of claim 1 further comprising a bias network adapted to provide a bias signal to the input of each of the transistors in the array of transistors based on a power control signal.

8. The power amplifier circuit of claim 1 further comprising at least one amplification stages adapted to amplify the radio frequency signal in each of the first and second frequency bands, each of the at least one amplification stages comprising:
   a first amplification circuitry adapted to amplify the radio frequency signal in the first frequency band and provide an amplified radio frequency signal in the first frequency band to the first matching circuit; and
   a second amplification circuitry adapted to amplify the radio frequency signal in the second frequency band and provide an amplified radio frequency signal in the second frequency band to the second matching circuit.

9. The power amplifier circuit of claim 8 further comprising a bias network adapted to provide a first bias signal to the input of each of the transistors in the array of transistors and provide separate bias signals to each of the first and second amplification circuitries in each of the at least one amplification stages.

10. The power amplifier circuit of claim 9 wherein when operating in a select frequency band of the first and second frequency bands, the bias network is further adapted to provide the separate bias signals such that a one of the first and second amplification circuitries in each of the at least one amplification stages corresponding to the select frequency band are active and an other of the first and second amplification circuitries in each of the at least one amplification stages not corresponding to the select frequency band are inactive.

11. The power amplifier circuit of claim 9 wherein an output power of each of the at least one amplification stages and the array of transistors is controlled based on controlling corresponding supply voltages.

12. The power amplifier circuit of claim 1 further comprising an output matching network having a variable impedance controlled by control circuitry, wherein the power amplifier output is coupled to radiation circuitry comprising an antenna via the output matching network.

13. The power amplifier circuit of claim 12 wherein the output matching network is adapted to transform a load impedance of the radiation circuitry into a predefined load impedance.

14. A communications system comprising:
   a modulator providing a radio frequency signal in one of a plurality of frequency bands; and
   a power amplifier circuit comprising:
      a plurality of input nodes adapted to receive the radio frequency signal, each of the plurality of input nodes corresponding to one of the plurality of frequency bands;
      an array of transistors, each transistor having an input and an output, wherein the outputs are coupled together to form a power amplifier output; and
      a plurality of matching circuits each coupling a corresponding one of the plurality of input nodes to the inputs of each transistor in the array of transistors, each of the plurality of matching circuits having a small impedance in the corresponding one of the plurality of frequency bands and a large impedance in others of the plurality of frequency bands.

15. The communications system of claim 14 wherein each of the plurality of matching circuits further comprises capacitive circuits coupling the corresponding one of the plurality of input nodes to the inputs of the transistors in the array of transistors.

16. The communications system of claim 15 wherein each of the plurality of matching circuits further comprises an inductive shunt circuit coupled to input terminals of the capacitive circuits.

17. The communications system of claim 16 wherein the inductive shunt circuits are part of an amplification stage adapted to amplify the radio frequency signal in each of the plurality of frequency bands.

18. The communications system of claim 16 wherein the inductive shunt circuits are coupled to ground.

19. The communications system of claim 16 wherein the inductive shunt circuits are coupled to a source voltage.

20. The communications system of claim 14 further comprising a bias network adapted to provide a bias signal to each of the transistors in the array of transistors based on a power control signal.

21. The communications system of claim 14 wherein the power amplifier circuitry further comprises at least one amplification stages adapted to amplify the radio frequency signal in each of the plurality of frequency bands, each of the at least one amplification stages comprising:

a plurality of amplification circuitries each adapted to amplify the radio frequency signal in a corresponding one of the plurality of frequency bands and provide an amplified radio frequency signal in the corresponding one of the plurality of bands to a corresponding one of the plurality of matching circuits.

22. The communications system of claim 21 further comprising a bias network adapted to provide a first bias signal to each of the transistors in the array of transistors and provide separate bias signals to each of the plurality of amplification circuitries in each of the at least one amplification stages.

23. The communications system of claim 22 wherein when operating in a select frequency band of the plurality of frequency bands, the bias network is further adapted to provide the separate bias signals such that a one of the plurality of amplification circuitries in each of the at least one amplification stages corresponding to the select frequency band are active and an other of the plurality of amplification circuitries in each of the at least one amplification stages not corresponding to the select frequency band are inactive.

24. The communications system of claim 22 wherein an output power of each of the at least one amplification stages and the array of transistors is controlled based on controlling corresponding supply voltages.

25. The communications system of claim 14 further comprising an output matching network having a variable impedance controlled by control circuitry of the communication system, wherein the power amplifier output is coupled to radiation circuitry comprising an antenna via the output matching network.

26. The communications system of claim 25 wherein the output matching network is adapted to transform a load impedance of the radiation circuitry into a predefined load impedance.

* * * * *